(12) United States Patent
Iino

(10) Patent No.: US 10,043,954 B2
(45) Date of Patent: Aug. 7, 2018

(54) LIGHTING DEVICE WITH A PHOSPHOR LAYER ON A PERIPHERAL SIDE SURFACE OF A LIGHT-EMITTING ELEMENT AND A REFLECTING LAYER ON AN UPPER SURFACE OF THE LIGHT-EMITTING ELEMENT AND ON AN UPPER SURFACE OF THE PHOSPHOR LAYER

(71) Applicants: CITIZEN ELECTRONICS CO., LTD., Yamanashi-ken (JP); CITIZEN WATCH CO., LTD., Tokyo (JP)

(72) Inventor: Takashi Iino, Yamanashi-ken (JP)

(73) Assignees: CITIZEN ELECTRONICS CO., LTD., Yamanashi-Ken (JP); CITIZEN WATCH CO., LTD., Tokyo (JP)

( * ) Notice: Subject to any disclaimer, the term of this patent is extended or adjusted under 35 U.S.C. 154(b) by 0 days.

(21) Appl. No.: 14/534,539

(22) Filed: Nov. 6, 2014

(65) Prior Publication Data

US 2015/0129902 A1 May 14, 2015

(30) Foreign Application Priority Data

Nov. 8, 2013 (JP) .................................. 2013-232427

(51) Int. Cl.
*H01L 25/075* (2006.01)
*H01L 33/50* (2010.01)
(Continued)

(52) U.S. Cl.
CPC ............ *H01L 33/505* (2013.01); *H01L 33/46* (2013.01); *H01L 33/60* (2013.01); *H01L 2224/16225* (2013.01); *H01L 2924/10155* (2013.01)

(58) Field of Classification Search
CPC ....... H01L 33/505; H01L 33/46; H01L 33/60; H01L 2224/16225; H01L 2924/10155
(Continued)

(56) References Cited

U.S. PATENT DOCUMENTS 6,345,903 B1 2/2002 Koike et al.
6,603,258 B1 8/2003 Mueller-Mach et al.
(Continued)

FOREIGN PATENT DOCUMENTS

JP 2004-207369 7/2004
JP 2010-045248 2/2010
(Continued)

OTHER PUBLICATIONS

Japanese Notification of Reasons for Refusal dated Jul. 26, 2017 in corresponding Japanese Patent Application No. 2013-232427 with English translation.

*Primary Examiner* — Peter Bradford
(74) *Attorney, Agent, or Firm* — Wenderoth, Lind & Ponack, L.L.P.

(57) ABSTRACT

In a first aspect of the present inventive subject matter, a lighting device includes a light-emitting element that includes a first electrode and a second electrode on a lower surface of the light-emitting element; a phosphor layer directly covering a peripheral side surface of the light-emitting element; and a light-reflecting layer that is in contact with an upper surface of the light-emitting element and in contact with an upper surface of the phosphor layer directly covering the peripheral side surface of the light-emitting element.

8 Claims, 15 Drawing Sheets

(51) Int. Cl.
*H01L 33/46* (2010.01)
*H01L 33/60* (2010.01)

(58) Field of Classification Search
USPC .......................................................... 257/88
See application file for complete search history.

(56) References Cited

U.S. PATENT DOCUMENTS

| | | | |
|---|---|---|---|
| 8,198,109 B2 | 6/2012 | Lerman et al. | |
| 8,242,518 B2 | 8/2012 | Lerman et al. | |
| 8,338,839 B2 | 12/2012 | Lerman et al. | |
| 8,338,840 B2 | 12/2012 | Lerman et al. | |
| 8,338,841 B2 | 12/2012 | Lerman et al. | |
| 8,338,842 B2 | 12/2012 | Lerman et al. | |
| 8,344,397 B2 | 1/2013 | Lerman et al. | |
| 2002/0185651 A1 | 12/2002 | Sommers | |
| 2005/0001537 A1* | 1/2005 | West | G02F 1/133603 313/500 |
| 2005/0002194 A1 | 1/2005 | Kikuchi et al. | |
| 2006/0197098 A1 | 9/2006 | Aihara | |
| 2008/0254558 A1 | 10/2008 | Han et al. | |
| 2011/0193105 A1* | 8/2011 | Lerman | H01L 25/0753 257/88 |
| 2011/0193106 A1 | 8/2011 | Lerman et al. | |
| 2011/0193114 A1 | 8/2011 | Lerman et al. | |
| 2011/0198631 A1 | 8/2011 | Lerman et al. | |
| 2011/0198632 A1 | 8/2011 | Lerman et al. | |
| 2011/0204390 A1 | 8/2011 | Lerman et al. | |
| 2011/0204391 A1 | 8/2011 | Lerman et al. | |
| 2011/0241030 A1* | 10/2011 | Kim | H01L 25/16 257/88 |
| 2012/0305971 A1* | 12/2012 | You | H01L 33/50 257/98 |
| 2013/0214300 A1 | 8/2013 | Lerman et al. | |
| 2013/0265757 A1* | 10/2013 | Tanaka | B60Q 1/04 362/235 |
| 2013/0292727 A1* | 11/2013 | Fuke | H01L 33/62 257/98 |
| 2014/0362603 A1* | 12/2014 | Song | G02B 6/0073 362/612 |
| 2015/0034987 A1* | 2/2015 | Hayashi | H01L 33/60 257/98 |
| 2015/0085527 A1* | 3/2015 | Nam | H01L 33/60 362/612 |
| 2015/0243842 A1* | 8/2015 | Bhat | H01L 21/0242 257/98 |
| 2016/0161064 A1 | 6/2016 | Lerman et al. | |

FOREIGN PATENT DOCUMENTS

| | | |
|---|---|---|
| JP | 2012-227230 | 11/2012 |
| JP | 2013-536592 | 9/2013 |

* cited by examiner

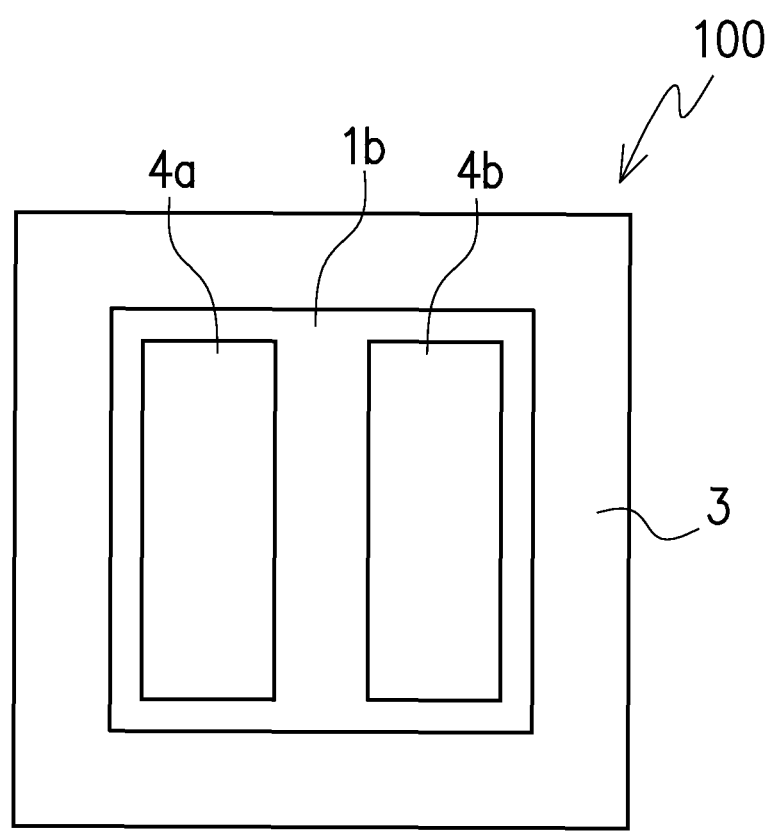

LIGHTING DEVICE WITH A PHOSPHOR LAYER ON A PERIPHERAL SIDE SURFACE OF A LIGHT-EMITTING ELEMENT AND A REFLECTING LAYER ON AN UPPER SURFACE OF THE LIGHT-EMITTING ELEMENT AND ON AN UPPER SURFACE OF THE PHOSPHOR LAYER

CROSS-REFERENCE TO RELATED APPLICATION

This application is a new U.S. patent application that claims benefit of JP2013-232427, filed on Nov. 8, 2013, the disclosures of which are incorporated herein by reference in its entirety.

BACKGROUND OF THE INVENTION

Field of the Invention

The present invention relates to a lighting device including a light-emitting element and a light-reflecting layer that is arranged on an upper surface of the light-emitting element, and relates to a lighting device including two or more light-emitting elements, a light-reflecting layer that is arranged on an upper surface of each one of the two or more light-emitting elements, and a frame member with openings each in which at least one of the two or more light-emitting elements is arranged.

Description of the Related Art

A lighting device including a reflective coating arranged on an encapsulant which seals an LED element is suggested in some patent applications.

For example, it is open to the public that a light-emitting diode (LED) package includes an LED die mounted onto a lead frame, and an encapsulant, which is preferably an epoxy resin, encapsulates and preferably hermetically seals the LED die. It is taught that the encapsulant includes depression defined by preselected curved surfaces, and the LED package further includes a reflective coating which coats a part of the preselected curved surfaces of the encapsulant and which is essentially opposite the LED die surface (For reference, see U.S. Unexamined Patent Application Publication No. US 2002/0185651 A1).

In addition, it is open to the public that a light-emitting diode includes an insulating circuit substrate with a metallic pad (not shown) formed on an upper surface of the insulating circuit substrate, an LED chip configured to emit ultraviolet light being die-bonded to the metallic pad and electrically connected to a pair of wiring pattern (not shown) formed on the circuit substrate by gold wires, a frame member that has a rectangular or circular frame shape and is made of epoxy resin or silicone resin containing phosphors, and a light-transmitting resin made of epoxy resin or silicone resin being filled in the frame member. The phosphors contained in the frame member are configured to be excited by ultraviolet light to emit visible light only from a peripheral side surface of the light-emitting diode through the frame member (For reference, see Japanese Unexamined Patent Application Publication No. 2010-45248).

Furthermore, a lighting device including a frame, reflector cup or partition is suggested in some patent applications. For example, it is open to the public that a surface mounting type white LED includes a chip substrate with at least a pair of surface mounting terminals, a blue LED chip mounted on the chip substrate and electrically connected to the pair of surface mounting terminals. The surface mounting type white LED further includes a frame-type member made of solder resist for example and formed on the chip substrate around a periphery of the blue LED, and a bonding agent that includes a phosphor to adhere the blue LED to the chip substrate, and a lens made of the transparent resin to seal the blue LED chip, the frame-type member, and the bonding agent layer on the chip substrate (For reference, see Japanese Unexamined Patent Application Publication No. 2004-207369).

Also, it is open to the public that a semiconductor light emitting device includes a circuit board, multiple LEDs mounted on the circuit board by flip chip mounting and serially connected, and electrodes for heat radiation on a rear surface side of the circuit board, and a sealing resin that may be a transparent resin or phosphor resin sealing the multiple LEDs mounted on the substrate (For reference, see Japanese Unexamined Patent Application Publication No. 2012-227230).

SUMMARY OF THE INVENTION

In a first aspect of the present inventive subject matter, a lighting device includes a light-emitting element including a first electrode and a second electrode on a lower surface of the light-emitting element; a phosphor layer directly covering a peripheral side surface of the light-emitting element; and a light-reflecting layer that is arranged in contact with an upper surface of the light-emitting element and arranged in contact with an upper surface of the phosphor layer directly covering the peripheral side surface of the light-emitting element.

It is disclosed that the light-reflecting layer includes a metallic layer.

Also, it is suggested that a metallic layer of the light-reflecting layer has a reflectivity of 50 percent or more.

Furthermore, it is disclosed that a light-emitting element and a phosphor layer are same in height.

It is disclosed that the phosphor layer is smaller than the light-emitting element in width.

It is suggested that the upper surface of the light-emitting element includes a sloping surface. Also, it is suggested that the light-reflecting layer includes a sloping metallic layer arranged in contact with the sloping surface of the upper surface of the light-emitting element.

It is suggested that the upper surface of the light-emitting element includes a concave surface. Also, it is suggested that the light-reflecting layer includes a concave metallic layer arranged in contact with the concave surface of the upper surface of the light-emitting element.

It is further suggested that the lighting device further includes a substrate including a first electrode and a second electrode arranged on an upper surface of the substrate. It is disclosed that the first electrode of the light-emitting element is electrically mounted on the first electrode arranged on the upper surface of the substrate, and the second electrode of the light-emitting element is electrically mounted on the second electrode arranged on the upper surface of the substrate.

In a second aspect of the present inventive subject matter, a lighting device includes a substrate that includes at least one pair of electrodes arranged on an upper surface of the substrate; two or more light-emitting elements each including a first electrode and a second electrode on a lower surface of the light-emitting element and electrically connected to the at least one pair of electrodes of the substrate; a phosphor layer arranged in contact with a peripheral side surface of each one of the two or more light-emitting elements; a light-reflecting layer that is arranged in contact with an upper surface of each one of the two or more light-emitting elements and in contact with an upper surface of the phosphor layer arranged in contact with the peripheral side surface of the each one of the two or more light-emitting elements.

It is suggested that the upper surface of each one of the two or more light-emitting elements includes a sloping surface.

Furthermore, it is suggested that the light-reflecting layer includes a metallic layer.

It is disclosed that the lighting device further includes a frame member including a white-colored resin and two or more openings each in which at least one light-emitting element of the two or more light-emitting elements is arranged, and the two or more openings of the frame member includes sloping surfaces each facing the peripheral side surface of each one of the two or more light-emitting elements.

Also, it is suggested that the frame member further includes a light-shielding member that is embedded in the white-colored resin of the frame member.

Also, it is disclosed that the two or more openings of the frame member may be aligned in a line.

Furthermore, it is disclosed that the two or more openings of the frame member may be arranged in a shape of grid.

BRIEF DESCRIPTION OF THE DRAWINGS

FIG. 1C is a schematic bottom plan view of lighting device shown in FIG. 1A, also showing a lower surface of a light-emitting element and a lower surface of a phosphor layer.

FIG. 2A is a schematic top plan view of lighting device according to the first variation of the second embodiment, showing a light-emitting element under a light-reflecting layer with a dotted line.

FIG. 2B is a schematic side view of lighting device shown in FIG. 2A.

FIG. 2C is a schematic side view of lighting device shown in FIG. 2A, showing a light-emitting element electrically mounted on a substrate.

FIG. 2A' is a schematic top plan view of lighting device according to the second variation of the second embodiment, showing a light-emitting element under a light-reflecting layer with a dotted line.

FIG. 2B' is a schematic side view of lighting device shown in FIG. 2A'.

FIG. 2C' is a schematic side view of lighting device shown in FIG. 2A', showing a light-emitting element electrically mounted on a substrate.

DETAILED DESCRIPTION OF THE EMBODIMENTS

As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising", "includes", "including", "contains", "containing", "has" and/or "having" when used herein, specify the presence of stated features, integers, elements, components, portion of an element, and/or groups but do not preclude the presence or addition of one or more other features, integers, elements, components, portions, and/or groups thereof.

Relative terms such as "above" or "below" or "top" or "bottom" or "upper" or "uppermost" or "lower" or "upward" or "downward" or "left" or "right" or "front" or "rear" may be used herein to describe a relationship of one element, portion, surface, area, or direction to another element, portion, surface, area, or direction as illustrated in the figures. It will be understood that these terms are intended to encompass different orientations of a device in addition to the orientation depicted in the figures.

Embodiments of the invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

Embodiments of the invention are described with reference to drawings included herewith. Same and/or similar reference numbers refer to same and/or similar and/or corresponding and/or related structures throughout. It should be noted that the drawings are schematic in nature.

Figure 1A:
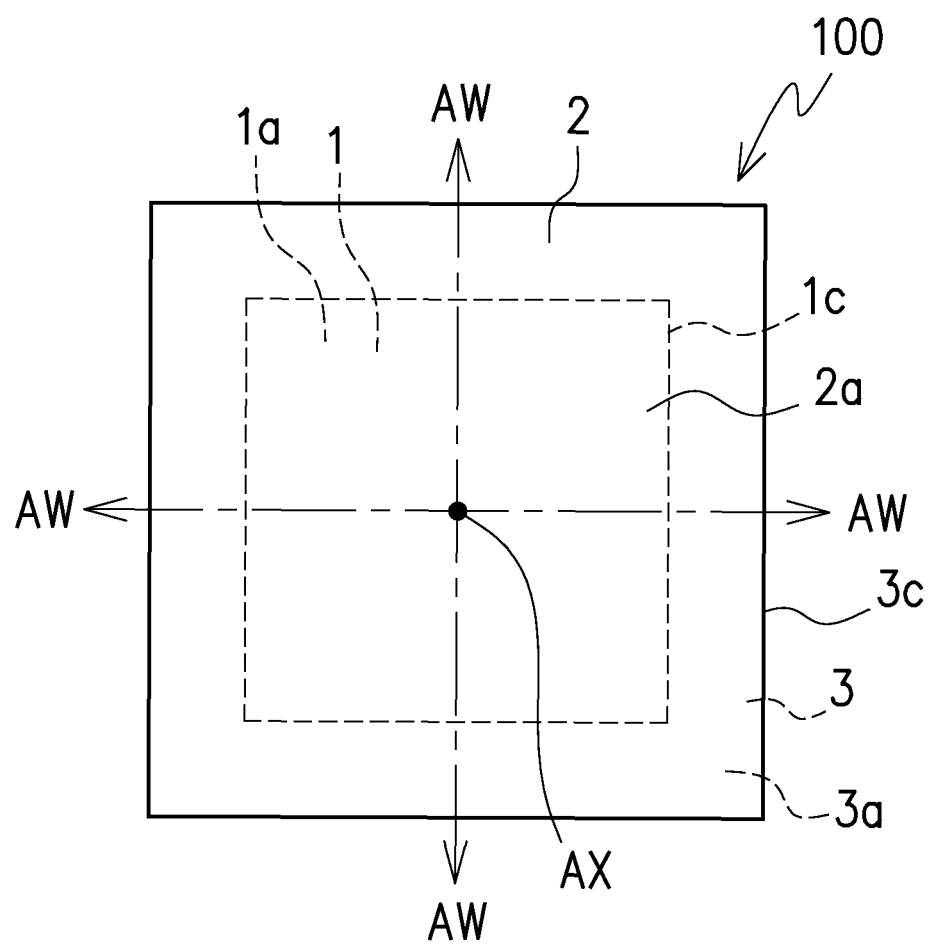
FIG. 1A is a schematic top plan view of lighting device according to a first embodiment of the present invention, showing a light-emitting element under a light-reflecting layer with a dotted line.

FIG. 1A is a schematic top plan view of lighting device according to a first embodiment of the present invention, showing a light-emitting element under a light-reflecting layer with a dotted line.

Figure 1B:
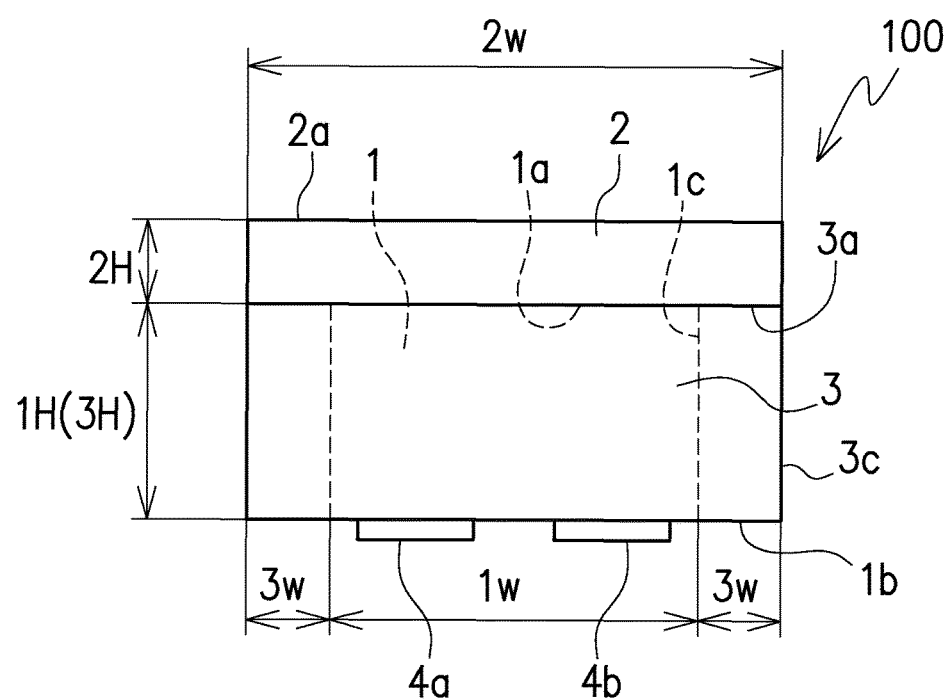
FIG. 1B is a schematic side view of lighting device shown in FIG. 1A.

FIG. 1B is a schematic side view of lighting device shown in FIG. 1A.

FIG. 1C is a schematic bottom plan view of lighting device shown in FIG. 1A, showing a lower surface of a light-emitting element and a lower surface of a phosphor layer.

A lighting device 100 of the first embodiment includes a light-emitting element 1 including a first electrode 4a and a second electrode 4b on a lower surface 1b of the light-emitting element 1, a phosphor layer 3 directly covering a peripheral side surface 1c of the light-emitting element 1, a light-reflecting layer 2 that is arranged in contact with an upper surface 1a of the light-emitting element 1 and arranged in contact with an upper surface 3a of the phosphor layer 3 directly covering the peripheral side surface 1c of the light-emitting element 1.

As shown in FIG. 1A, the upper surface 2a of the light-reflecting layer 2 is larger than the upper surface 1a of the light-emitting element 1 shown with the dotted line.

Furthermore, in this embodiment, the upper surface 2a of the light-reflecting layer 2 has the same size as a total size of the upper surface 1a of the light-emitting element 1 and the upper surface 3a of the phosphor layer 3.

Also, as shown in FIG. 1B, the width 2w of the light-reflecting layer 2 is the same width as a total width (3w+1w+3w) of the light-emitting element 1 and the phosphor layer 3 coating a peripheral side surface 1c of the light-emitting element 1.

Since the phosphor layer 3 is arranged in contact with the peripheral side surface 1c of the light-emitting element 1 as a layer having a constant width (3w), light from the peripheral side surface 1c of the light-emitting element 1 is configured to be converted by a phosphor that is included in the phosphor layer 3 at a constant rate in each of four directions of the peripheral side surface 1c. The four directions are shown as four arrows AW in FIG. 1A. Accordingly, unnecessary excitement of light by phosphor is avoidable with this configuration.

A light-emitting element 1 included in the lighting device 100 may be configured to emit light with peak emission spectrum in a range of 350 nm to 560 nm. Light with peak emission spectrum range 490 nm-560 nm may appear to be green light, light with peak emission spectrum range 400 nm-490 nm may appear to be blue light, and light with emission spectrum peak range 350 nm-400 nm may appear to be near ultraviolet light. Light with peak emission spectrum range 10 nm-350 nm may be categorized as ultraviolet light.

The phosphor included in the phosphor layer 3 is selectable from phosphors that are excitable in response to light from a light-emitting element 1. Because the phosphor layer 3 is directly arranged on a peripheral side surface 1c of the light-emitting element 1 as a layer, arrangement of two or more light-emitting elements 1 with the phosphor layers 3 that may include a same and/or different phosphor from each other is possible corresponding to a required light color.

The light-emitting element 1 may be ultraviolet light-emitting diode element. For example, if the light-emitting element 1 is a light-emitting element with emission spectrum peak range from 380 nm to 400 nm, a phosphor or a combination of two or more phosphors including red phosphor, yellow phosphor, green phosphor and blue phosphor are selectable.

Also, the light-emitting element 1 may be blue light-emitting diode element. When a light-emitting element with peak emission spectrum in the range of 440 nm-460 nm is used as the light-emitting element 1, a phosphor included in the phosphor layer 3 is selectable among various phosphors that are excitable by light from the light-emitting element with peak emission spectrum in the range of 440 nm-460 nm.

For example, various phosphors include red phosphor, yellow phosphor, and green phosphor may be used with the light-emitting element.

As a red phosphor, $(Ca, Sr)AlSiN_3:Eu$, $CA_2Si_5N_8:Eu$, $AlSiN_3:Eu$, $CaSi_5N_8:Eu$, $K_2SiF_6:Mn$ and/or $K_2TiF_6:Mn$ is selectable, just as an example.

Also, as a yellow phosphor, $Y_3Al_5O_{12}:Ce$ (Usually called as "YAG"), $(Sr, Ba)_2SiO_4:Eu$, $Ca_x(Si, Al)_{12}(O, N)_{16}:Eu$ is selectable, just as an example.

As a green phosphor, $(Lu, Y)_3Al_5O_{12}:Ce$, $Y_3(Ga, Al)_5O_{12}:Ce$, $Ca_3Sc_2Si_3O_{12}:Ce$, $CaSc_2O_4:Eu$, $(Ba, Sr)_2SiO_2:Eu$, $Ba_3Si_6O_{12}N_2:Eu$, $(Si, Al)_6(O,N)_8:Eu$, is selectable, just as an example.

As a blue phosphor, $BaMgAl_{10}O_{17}:Eu$, just as an example.

Next, regarding the light-reflecting layer 2, since the light-emitting element 1 and the phosphor layer 3 are the same in height 1H (3H) in this embodiment, the light-reflecting layer 2 is arranged on an upper surface 1a of the light-emitting element 1 and on an upper surface 3a of the phosphor layer 3 as a flat layer. The height 2H of the light-reflecting layer is smaller than one half of the height 1H (3H) of the light-emitting element 1 or the phosphor layer 3.

FIG. 1C shows a schematic view in which the first electrode 4a and the second electrode 4b formed on the lower surface 1b of the light-emitting element 1 appear to be the same size and shape. However, the electrodes are, of course, not limited to a same size and/or shape shown in FIG. 1C. It is possible that the first electrode 3a and the second electrode 4b at the lower surface 1b of the light-emitting element 1 are different in size and/or shape.

Figure 1D:
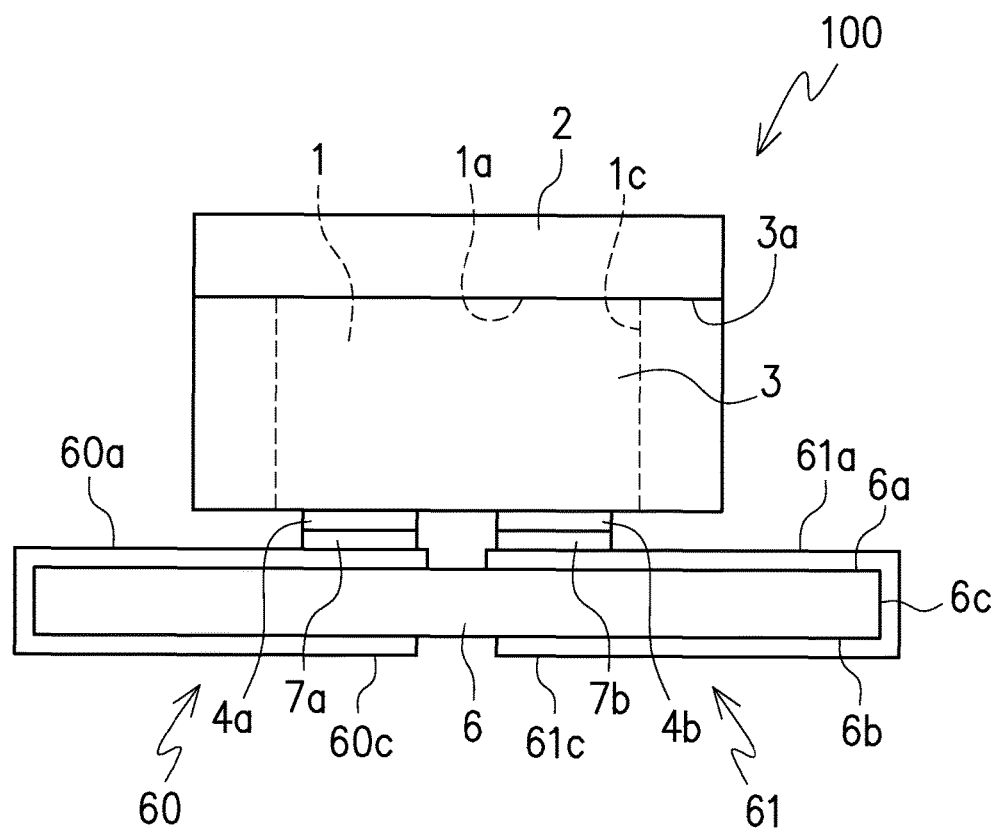
FIG. 1D is a schematic side view of lighting device shown in FIG. 1A, further including a substrate on which the light-emitting element is electrically mounted.

FIG. 1D is a schematic side view of lighting device shown in FIG. 1A, further including a substrate 6 on which the light-emitting element 1 is electrically mounted. The substrate 6 includes at least one pair of electrodes that are electrically connectable to the first electrode 4a and the second electrode 4b of the light-emitting element 1.

In this embodiment, the substrate 6 includes a first electrode 60 and the second electrode 61. As shown in FIG. 1D, a lighting device 100 includes a substrate 6 including a first electrode 60 and a second electrode 61 arranged on an upper surface 6a of the substrate 6, a light-emitting element 1 with a first electrode 4a and a second electrode 4b of the light-emitting element 1 being electrically mounted on the first electrode 60 and the second electrode 61 arranged on the upper surface 6a of the substrate 6. Two or more light-emitting elements 1 may be electrically mounted on the first electrode 60 and the second electrode 61 of the substrate 6. The two or more light-emitting elements 1 may be electrically connected in parallel with each other of the light-emitting elements 1 to the first electrode 60 and the second electrode 61 of the substrate 6.

For more details, the first electrode 4a of the light-emitting element 1 is mounted on the first electrode 60 of the substrate 6 through an electrically-conductive paste 7a, and the second electrode 4b of the light-emitting element 1 is mounted on the second electrode 61 of the substrate 6 through an electrically-conductive paste 7b. Regarding the electrically-conductive paste, it may be a soldering ball. Also, the electrically-conductive paste may be an electrically-conductive adhesive including a thermo-setting binder and a metallic particle contained in the thermo-setting binder.

The first electrode 60 of the substrate 6 includes an upper electrode portion 60a arranged on an upper surface 6a of the substrate 6 and a lower electrode portion 60c arranged on a lower surface 6b of the substrate 6. The upper electrode portion 60a and the lower electrode portion 60b of the first electrode 60 of the substrate 6 are connected. In this embodiment, the first electrode 60 of the substrate 6 extends from the upper surface 6a of the substrate 6 partly onto the peripheral side surface 6c of the substrate 6 to the lower surface 6b of the substrate 6.

Also, the second electrode 61 of the substrate 6 includes an upper electrode portion 61a arranged on an upper surface 6a of the substrate 6 and a lower electrode portion 61c arranged on a lower surface 6b of the substrate 6. The upper electrode portion 61a and the lower electrode portion 61b of the second electrode 61 of the substrate 6 are connected. In this embodiment, the second electrode 61 of the substrate 6 extends from the upper surface 6a of the substrate 6 partly onto the peripheral side surface 6c of the substrate 6 to the lower surface 6b of the substrate 6.

The first electrode 60 and the second electrode 61 of the substrate 6 are electrically spaced from each other.

Figure 2A:
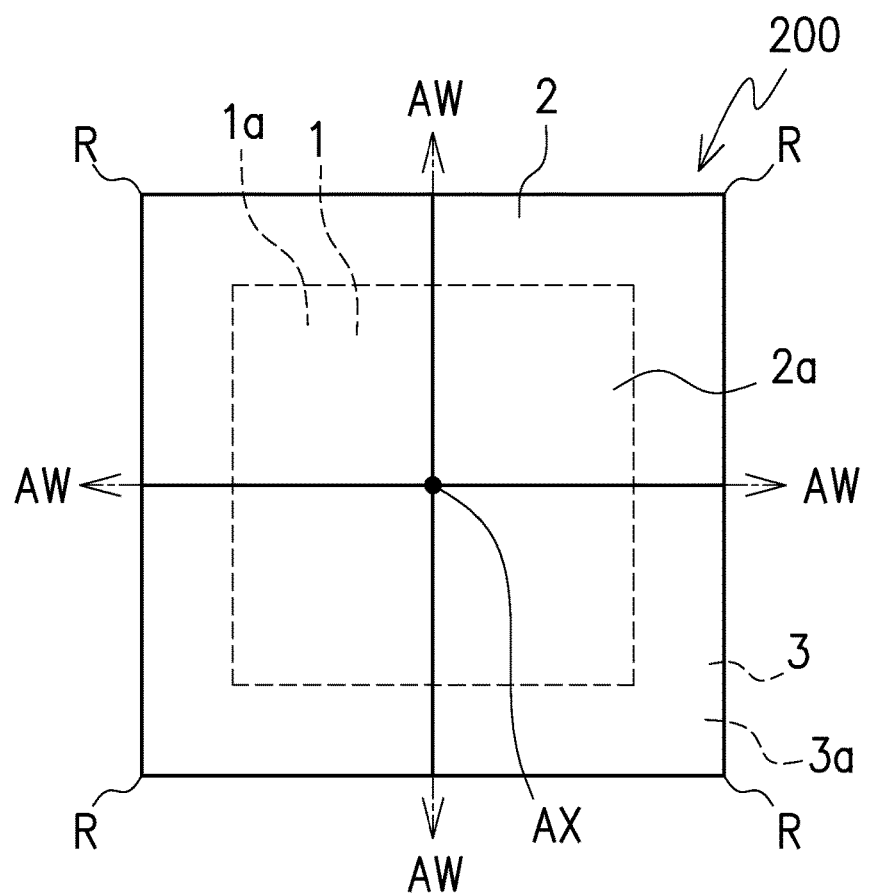
FIGS. 2A-2C show a first variation of lighting device according to a second embodiment of the present invention, and FIGS. 2A'-2C' show a second variation of lighting device according to the second embodiment of the present invention.
Figure 2B:
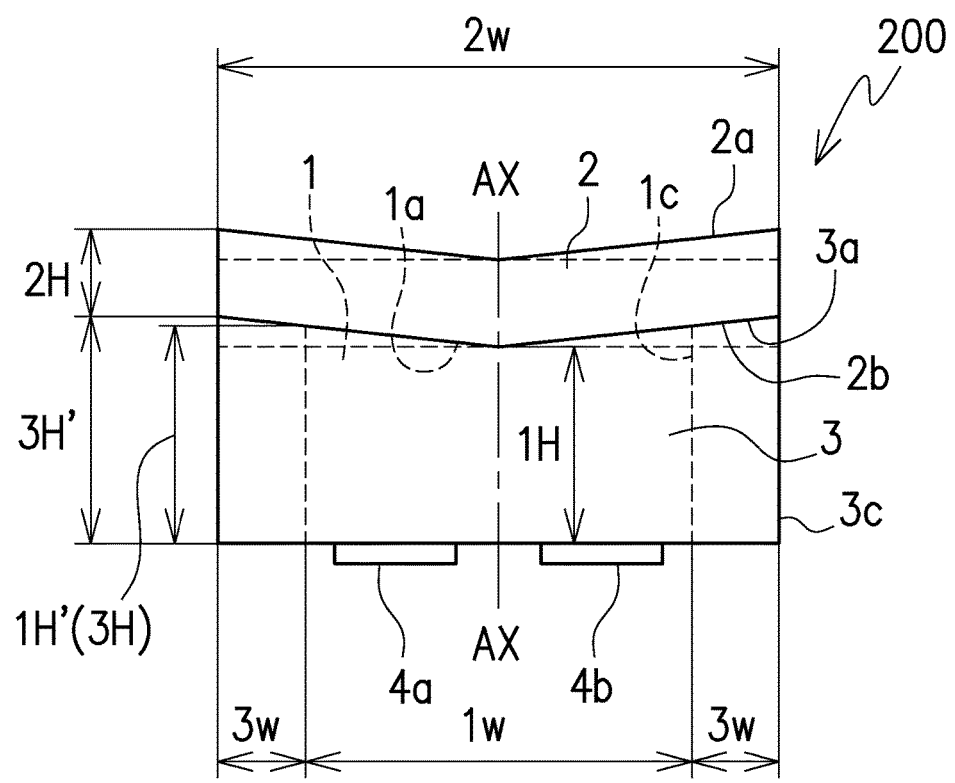
Figure 2C:
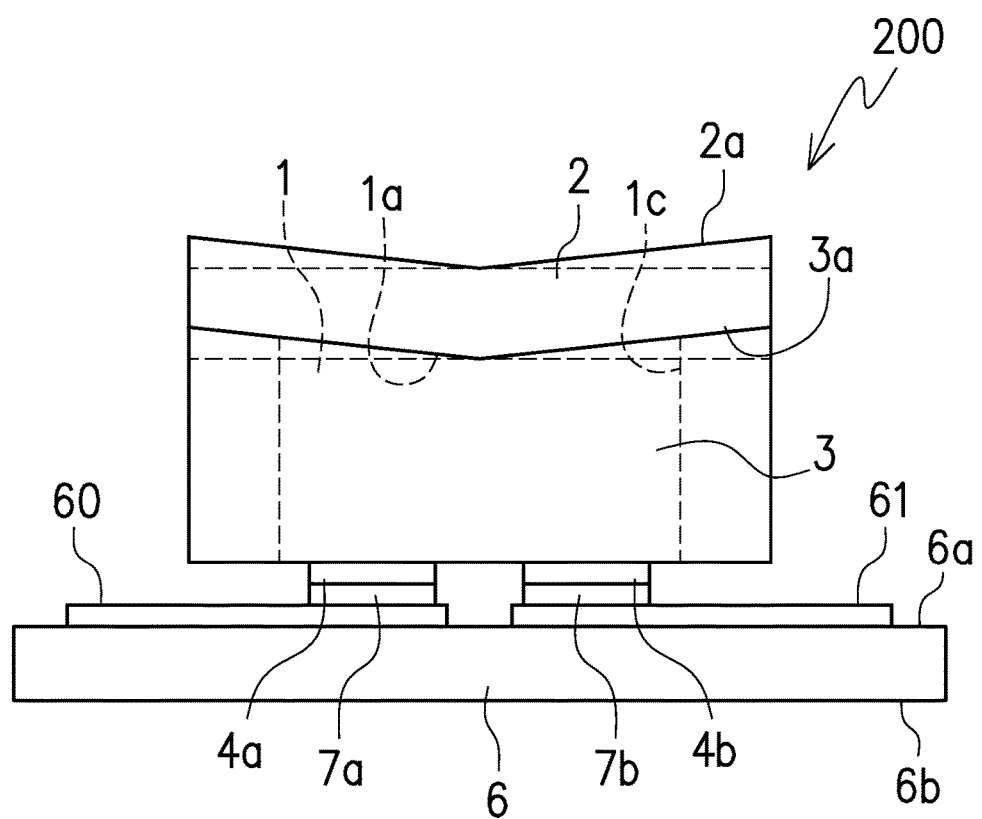
Figure 2A:
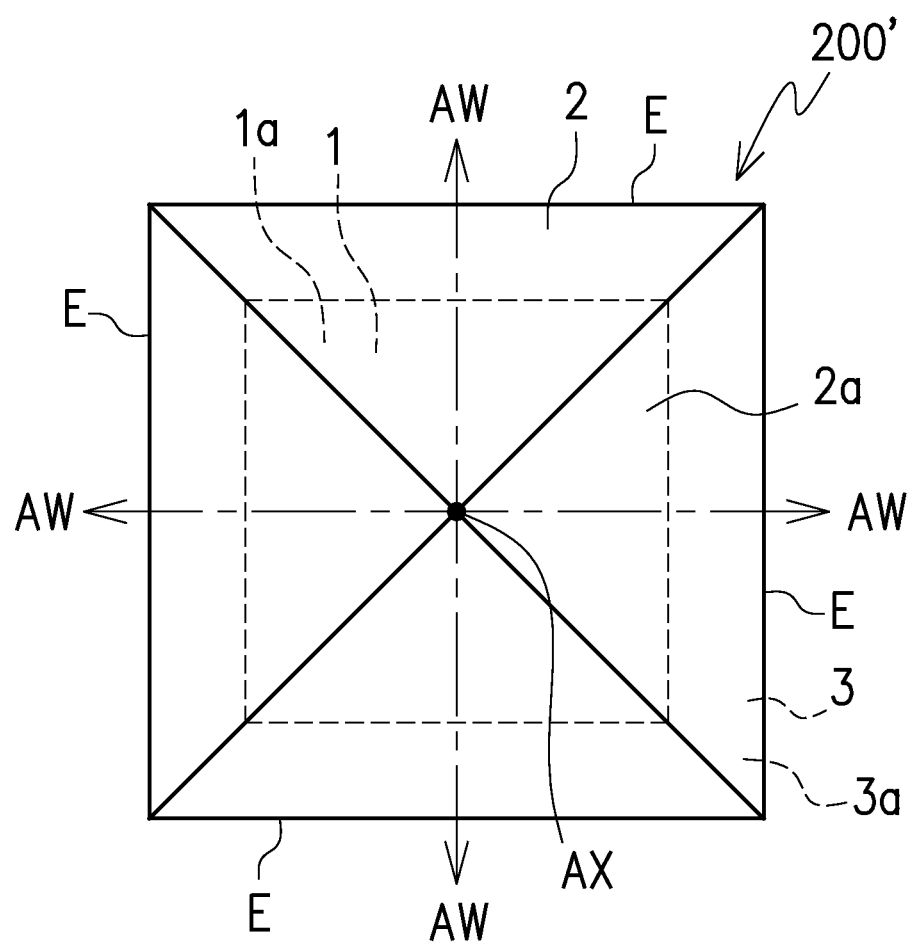
Figure 2B:
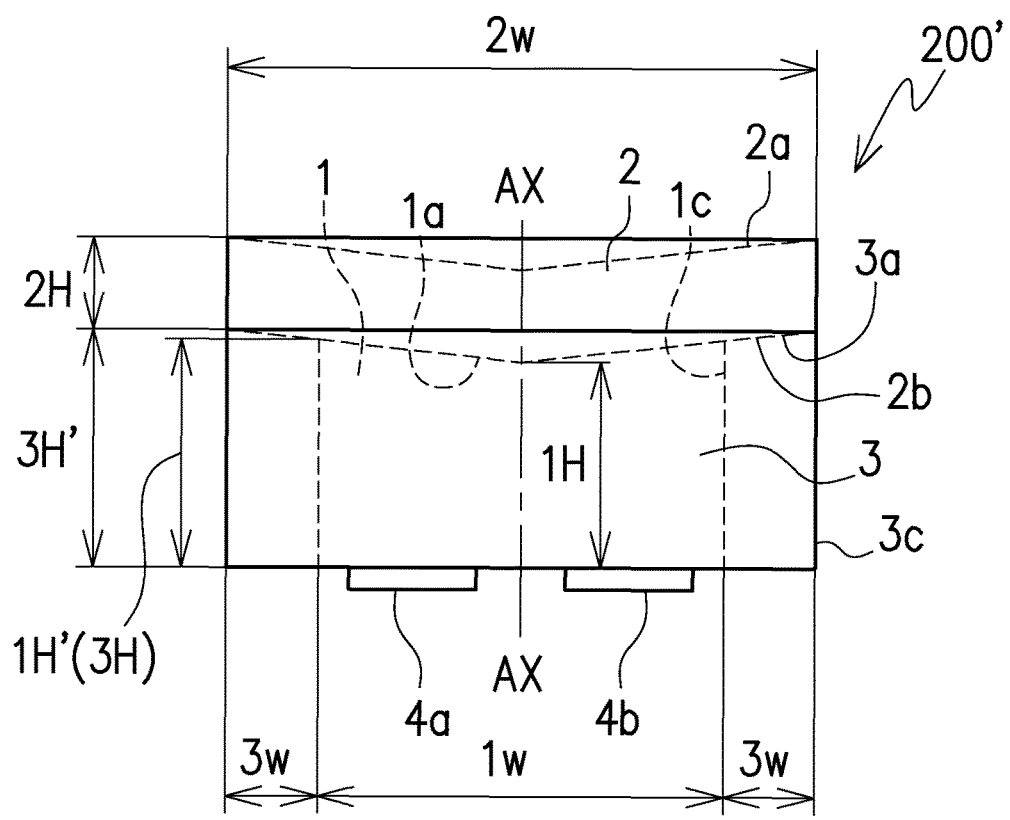
Figure 2C:
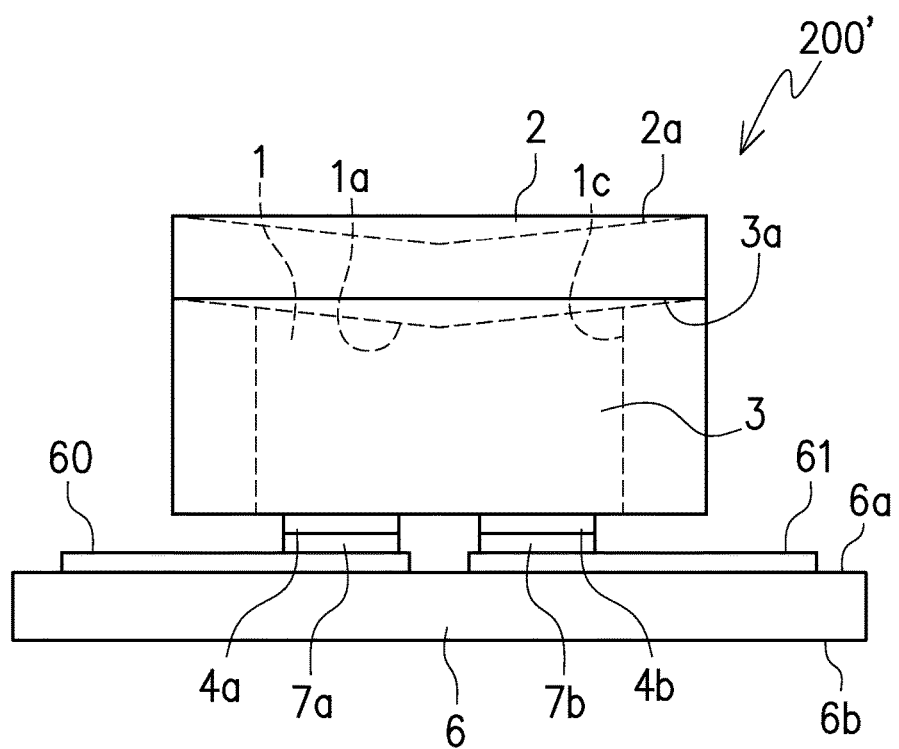

FIGS. 2A-2C show a first variation of lighting device 200 according to a second embodiment of the present invention, and FIGS. 2A'-2C' show a second variation of lighting device 200' according to the second embodiment of the present invention.

FIG. 2A is a schematic top plan view of lighting device 200 according to the first variation of the second embodiment, showing a light-emitting element 1 under a light-reflecting layer 2 with a dotted line.

FIG. 2B is a schematic side view of lighting device 200 shown in FIG. 2A.

FIG. 2C is a schematic side view of lighting device 200 shown in FIG. 2A, showing a light-emitting element 1 electrically mounted on a substrate 6.

Different from the first embodiment, in the lighting device 200 as the first variation of the second embodiment, the upper surface 1a of the light-emitting element 1 includes a sloping surface. In the first variation of the second embodiment as shown in FIGS. 2A-2C, the upper surface 1a of the light-emitting element 1 includes a concave surface which slants downward from four corners of the upper surface 1a of the light-emitting element to the central axis AX of the light-emitting element 1. For more details, the upper surface 1a of the light-emitting element 1 and the upper surface 3a of the phosphor layer 3 that are connected include a common concave surface which slants downward from four corners R of the upper surface 3a of the phosphor layer 3 to the central axis AX of the light-emitting element 1.

FIG. 2A' is a schematic top plan view of lighting device 200' according to the second variation of the second embodiment, showing a light-emitting element 1 under a light-reflecting layer 2 with a dotted line.

FIG. 2B' is a schematic side view of lighting device 200' shown in FIG. 2A'.

FIG. 2C' is a schematic side view of lighting device 200' shown in FIG. 2A', showing a light-emitting element 1 electrically mounted on a substrate 6.

In the second variation of the second embodiment as shown in FIGS. 2A'-2C', the upper surface 1a of the light-emitting element 1 includes a concave surface which slants downward from four edges of the upper surface 1a of the light-emitting element 1 toward the central axis AX of the light-emitting element 1. For more details, the upper surface 1a of the light-emitting element 1 and the upper surface 3a of the phosphor layer 3 that are connected include a common concave surface which slants downward from four edges E of the upper surface 3a of the phosphor layer 3 toward the central axis AX of the light-emitting element 1. The concave surface formed by the upper surface 1a of the light-emitting element 1 and the upper surface 3a of the phosphor layer 3 may include a pyramidal concave surface.

The concave surface of the upper surface 1a of the light-emitting element 1 may include a pyramidal concave surface.

Also, as shown in FIG. 2A and FIG. 2A', the upper surface 2a of the light-reflecting layer 2 is larger than the upper surface 1a of the light-emitting element 1.

In this embodiment, the upper surface 2a of the light-reflecting layer 2 is arranged to be in contact with the upper surface 1a of the light-emitting element 1 and the upper surface 3a of the phosphor layer 3. In short, as shown in FIG. 2B, the width 2w of the light-reflecting layer 2 is the same width as a total width (3w+1w+3w) of the light-emitting element 1 and the phosphor layer 3 coating a peripheral side surface 1c of the light-emitting element 1.

Different from the first embodiment, in the lighting device 200(200') of the second embodiment, since the upper surface 1a of the light-emitting element 1 includes a sloping surface, which slants toward the central axis AX of the light-emitting element 1, as shown in FIG. 2B, the light-reflecting layer 2 also includes a sloping surface. As a variation, the sloping surface of the light-emitting element 1 and the sloping surface of the light-reflecting layer 2 may curve. Also, the upper surface 3a of the phosphor layer 3 may include a sloping surface, which slants from an outer peripheral edge toward the central axis AX of the light-emitting element 1 around the upper surface 1a of the light-emitting element 1. Accordingly, the upper surface 3a of the phosphor layer and the upper surface 1a of the light-emitting element 1 may slant together.

Also, the upper surface 1a of the light-emitting element 1 may include a concave surface. The upper surface 1a of the light-emitting element 1 may include a pyramidal concave surface, which is centered on the central axis AX of the light-emitting element 1.

The light-reflecting layer 2 may include a sloping metallic layer arranged in contact with the sloping surface of the upper surface 1a of the light-emitting element 1.

Also, the light-reflecting layer 2 may include a concave metallic layer arranged in contact with the concave surface of the upper surface 1a of the light-emitting element 1.

Since the light-reflecting layer 2 is directly arranged on the upper surface 1a of the light-emitting element 1 and the upper surface 3a of the phosphor layer 3, the light-reflecting layer may include a sloping surface, which is centered on the central axis AX of the light-emitting element 1. The light-reflecting layer 2 may include a light-reflective particle.

For example, the sloping surface of the light-reflecting layer 2 may be a sloping metallic layer. The sloping metallic layer of the light-reflecting layer 2 may be a mirror surface. The mirror surface has a reflectivity of 50 percent or more. Depending to an objection, design and/or requirement as a lighting device, the metallic layer of the light-reflecting layer 2 may be positioned at the upper surface of the light-reflecting layer 2, and may be required to have a reflectivity close to 100 percent. The light-reflecting layer 2 may include one or more layers. The metallic layer may include silver and/or aluminum, for example.

For example, the light-reflecting layer 2 may include a layer made of silicone resin including titanium oxide ($TiO_2$) particle as a reflective particle. The frame member 30 may be opaque. As a reflective particle, titanium oxide particle, silicon dioxide particle, zirconium dioxide, aluminum oxide particle, and/or boron nitride particle is available.

As a variation, the sloping surface of the light-reflecting layer 2 may curve.

Compared to the light-reflecting layer 2 arranged on the upper surface 1a as a level surface of the light-emitting element 1 as shown in FIG. 1B, for example, the light-reflecting layer 2 including a sloping surface along the sloping surface of the upper surface 1a of the light-emitting element 1 as shown in FIG. 2B is able to reflect light to be emitted through the peripheral side surface 3a of the phosphor layer 3 with wider-angle.

As shown in the schematic side view of FIG. 2B (2B'), the height of the light-emitting element 1 is greater at a position 1H' of the peripheral side surface 1c of the light-emitting element 1 than at a position 1H of the central axis AX of the light-emitting element 1. Also, the height of the phosphor layer 2 is greater at a position 3H' of the peripheral side surface 3c of the phosphor layer 3 than at a position 1H' (3H) adjacent to the peripheral side surface 1c of the light-emitting element 1.

The height 2H of the light-reflecting layer is smaller than one half of the height 1H (1H') of the light-emitting element 1 or one half of the height 3H (3H') of the phosphor layer 3 in any position. The height 2H of the light-reflecting layer may be constant. However, of course it is possible that the height 2H of the light-reflecting layer may be varied not to be constant, depending on an object, design, and/or requirement as a lighting device.

FIG. 2C or FIG. 2C' is a schematic side view of lighting device shown in FIG. 2A or FIG. 2A', showing a light-emitting element 1 electrically mounted on a substrate 6. The substrate 6 includes at least one pair of electrodes that are electrically connectable to the first electrode 4a and the second electrode 4b of the light-emitting element 1.

In this embodiment, the substrate 6 includes a first electrode 60 and the second electrode 61 arranged on an upper surface 6a of the substrate 6. As shown in 2C, a lighting device 200 includes a substrate 6 including a first electrode 60 and a second electrode 61 arranged on an upper surface 6a of the substrate 6, a light-emitting element 1 with a first electrode 4a and a second electrode 4b of the light-emitting element 1 being electrically mounted on the first electrode 60 and the second electrode 61 arranged on the upper surface 6a of the substrate 6. Two or more light-emitting elements 1 may be electrically mounted on the first electrode 60 and the second electrode 61. The two or more light-emitting elements may be electrically connected in parallel with one another of the light-emitting elements 1 to the first electrode 60 and the second electrode 61 of the substrate 6.

The first electrode 4a of the light-emitting element 1 is mounted on the first electrode 60 of the substrate 6 through an electrically-conductive paste 7a. The second electrode 4b of the light-emitting element 1 is mounted on the second electrode 61 of the substrate 6 through an electrically-conductive paste 7b. The first electrode 60 and the second electrode 61 of the substrate 6 are electrically spaced from each other. The number, size, position, and/or shape of the electrodes of the substrate can be selectable depending on an object, design, and/or requirement as alighting device.

Figure 3A:
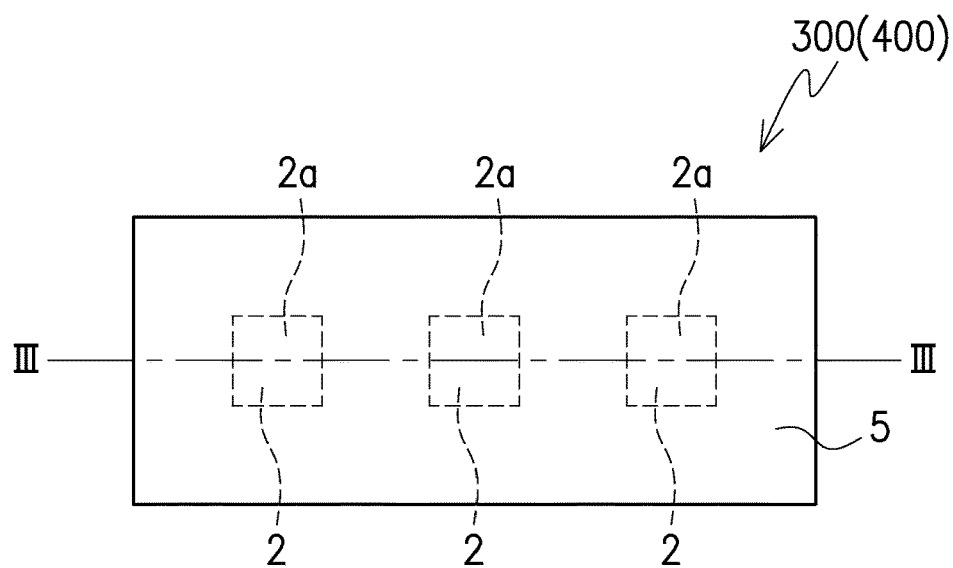
FIG. 3A is a schematic top plan view of lighting device according to third and fourth embodiments of the present invention.

FIG. 3A is a schematic top plan view of lighting device according to third and fourth embodiments of the present invention.

Figure 3B:
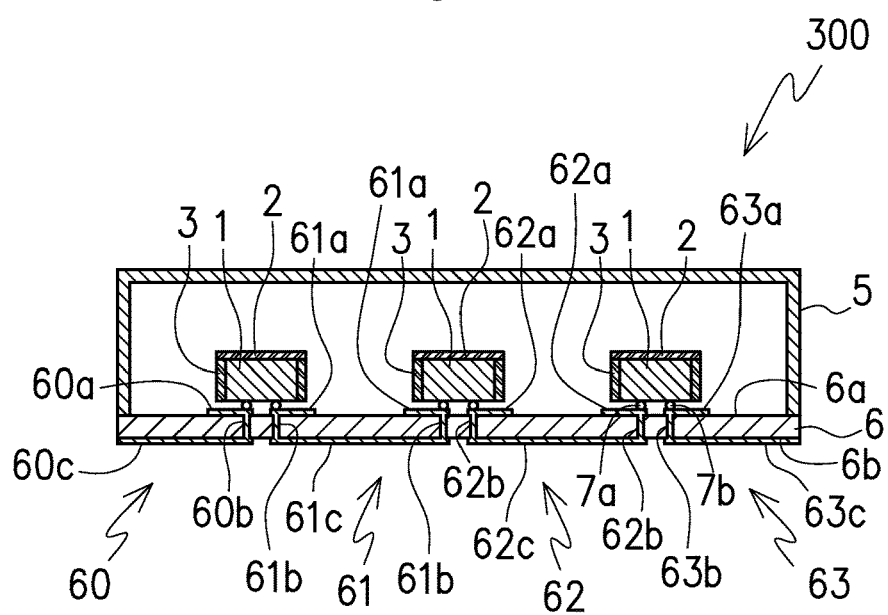
FIG. 3B is a cross sectional view of lighting device taken along a line shown in FIG. 3A as the third embodiment.

FIG. 3B is a cross sectional view of lighting device taken along a line III-III shown in FIG. 3A as the third embodiment.

A lighting device 300 according to the third embodiment of the present invention includes a substrate 6 including a pair of electrodes arranged on an upper surface 6a of the substrate 6, two or more light-emitting elements 1 each including a first electrode 4a and a second electrode 4b on a lower surface 1b of each one of the two or more light-emitting elements 1, a phosphor layer 3 arranged in contact with a peripheral side surface 1c of each one of the two or more light-emitting elements 1, and a light-reflecting layer 2 that is arranged in contact with an upper surface 1a of each one of the two or more light-emitting elements 1 and in contact with an upper surface 3a of the phosphor layer 3 in contact with the peripheral side surface 1c of the each one of the light-emitting element 1.

The substrate 6 includes at least a pair of electrodes. For more details, a first light-emitting element 1 is electrically mounted on a first electrode 60 and a second electrode 61. A second light-emitting element 1 is electrically mounted on the second electrode 61 and a third electrode 62. A third light-emitting element 1 is electrically mounted on the third electrode 62 and a fourth electrode 63. Each electrode of the first electrode 60, the second electrode 61, the third electrode 62, and the fourth electrode 63 include an upper electrode, a lower electrode and a through-hole electrode. The first electrode 60 includes a first upper electrode 60a arranged on the upper surface 1a of the substrate 1, a first lower electrode 60c arranged on a lower surface 1b of the substrate 1, and a first through-hole 60b extending in the substrate 1 and electrically connected to the first upper electrode 60a and the first lower electrode 60c. Also, the second electrode 61 includes an upper electrode 61a arranged spaced away from the upper electrode 60a of the first electrode 60, a lower electrode 61c arranged spaced away from the lower electrode 60c of the first electrode 60, and a through-hole 61b spaced away from the first through-hole 60b and extending in the substrate 1 and electrically connected to the second upper electrode 61a and the second lower electrode 61c. Furthermore, the third electrode 62 includes an upper electrode 62a arranged spaced away from the upper electrode 61a of the second electrode 61, a lower electrode 62c arranged spaced away from the lower electrode 61c of the second electrode 61. In addition, the fourth electrode 63 includes an upper electrode 63a arranged spaced away from the upper electrode 62a of the third electrode 62, a lower electrode 63c arranged spaced away from the lower electrode 62c of the third electrode, and a through-hole 63b spaced away from the through-hole 63b of the fourth electrode 63.

Accordingly, these three light-emitting elements 1 are electrically connected in series as shown in FIG. 3B.

However, the number of light-emitting elements that are connected in series, in parallel or a combination of serial connection and parallel connection may be selectable according to a design, size, and/or a required brightness of a lighting device, for example. Also, the arrangements of electrodes and through-holes on the substrate may be selectable according to the number of light-emitting element to be mounted on a substrate, a design, size, and/or a required brightness of a lighting device, for example.

The lighting device 300 may include a light-transmitting cover 5 that is arranged above the two or more light-emitting elements. The light-transmitting cover 5 may be transparent or translucent cover, which may reflect apart of light emitted through the phosphor layer 3 arranged on the peripheral side surface 1c of each one of the two or more light-emitting elements 1. The light-reflecting layer 2 arranged on an upper surface of each one of the two or more light-emitting elements 1 with a reflectivity of 50 percent or more is expected to reflect light that is reflected by the light-transmitting cover 5, and thus, variations of brightness at different positions through the light-transmitting cover 5 will be suppressed by the light-reflecting layer 2.

Figure 3C:
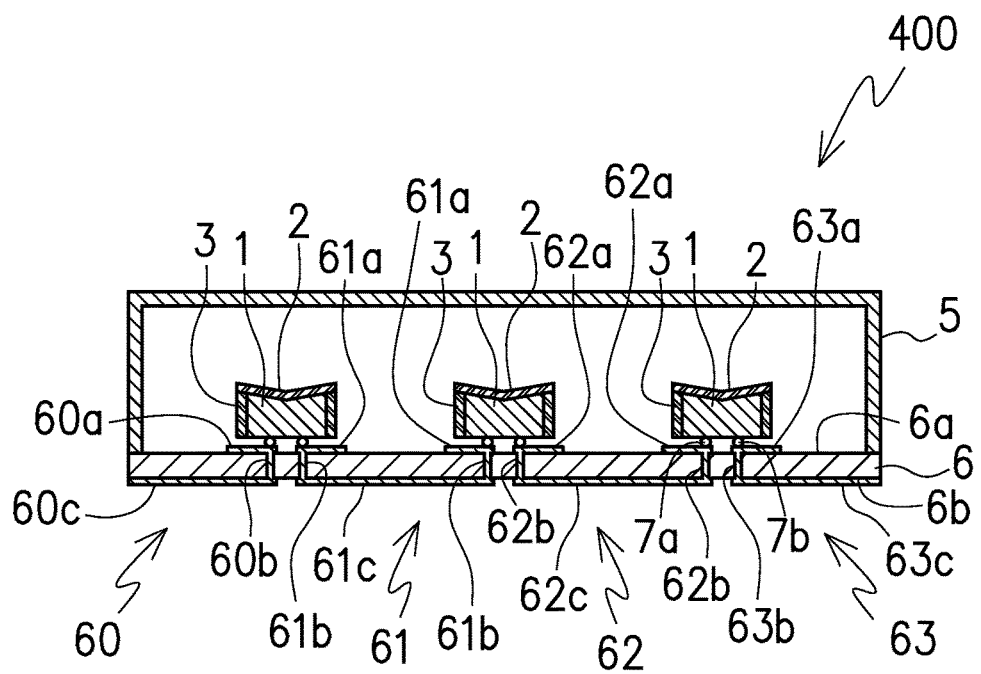
FIG. 3C is a cross sectional view of lighting device taken along a line shown in FIG. 3A as the fourth embodiment.

FIG. 3C is a cross sectional view of lighting device taken along a line III-III shown in FIG. 3A as the fourth embodiment.

Different from the lighting device 300 according to the third embodiment mentioned above, a lighting device 400 according to the fourth embodiment of the present invention includes the two or more light-emitting elements 1 electrically arranged in series in the light-transmitting cover 5 include a sloping surface at an upper surface 1a of each one of the light-emitting element 1 as explained in the second embodiment as the first variation with FIGS. 2A-2C and as the second variation with FIGS. 2A'-2C'.

Furthermore, the upper surfaces 2a of the light-reflecting layers 2 include sloping surfaces as explained in the second embodiment as the first variation with FIGS. 2A-2C and as the second variation with FIGS. 2A'-2C'. Accordingly, light reflected on the light-transmitting cover 5 will be again reflected upward with a wider-angle by the sloping surface of the upper surface 2a of the light-reflecting layer 2, compared to the light-reflecting layer 2 that is a flat layer arranged on the upper surface 1a as a level surface of the light-emitting element 1.

Explanations regarding the substrate 6 and the light-transmitting cover 5 and so on of the lighting device 400 can be referred to the explanations of the lighting device 300 according to the third embodiment mentioned above.

Figure 4A:
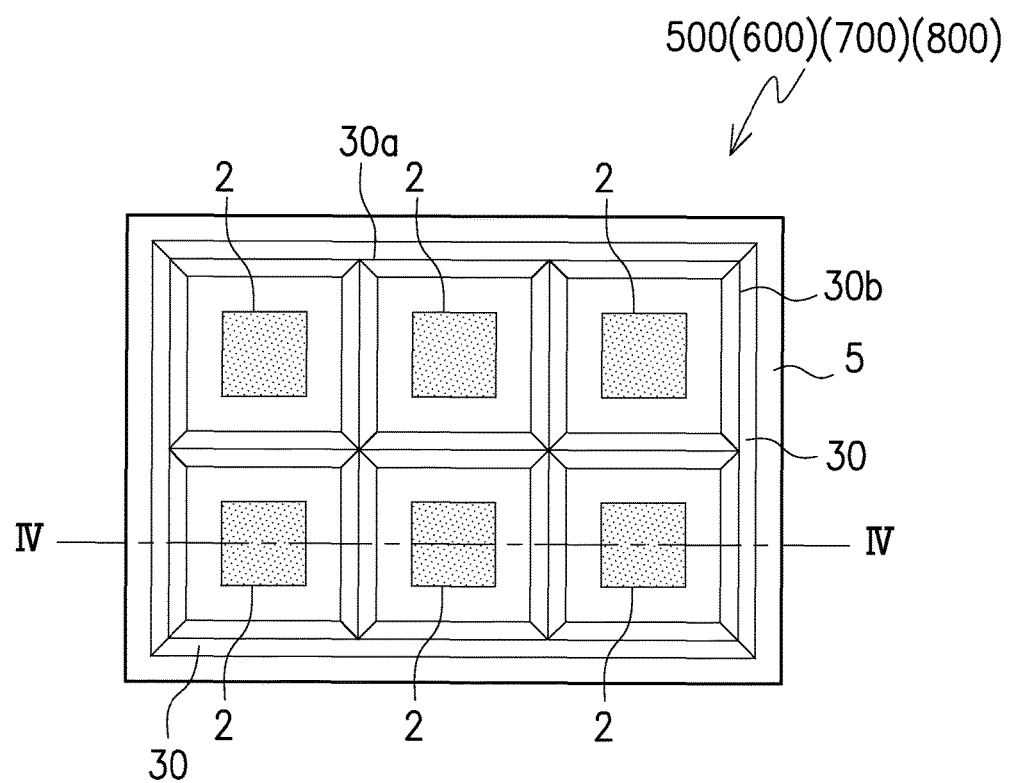
FIG. 4A is a schematic top plan view of lighting device according to fifth to eighth embodiments of the present invention.

FIG. 4A is a schematic top plan view of lighting device according to fifth to eighth embodiments of the present invention.

The lighting device 500, (600), (700) or (800) shown in FIGS. 4A-4E includes a frame member 30. The frame member 30 includes a white-colored resin and two or more openings each in which at least one light-emitting element 1 of the two or more light-emitting elements 1 is arranged, and the two or more openings of the frame member includes sloping surfaces 30a each facing the peripheral side surface 3c of the phosphor layer 3 that directly covers the peripheral side surface 1c of each one of the two or more light-emitting elements 1.

With a frame member 30 surrounding at least one light-emitting element 1 of the two or more light-emitting elements 1, it is possible to make directivity of light through a region in an opening of the frame member 30, efficiently making use of light emitted from the peripheral side surface 1c of the light-emitting element 1 through the phosphor layer 3 as upward light.

Also, as shown in FIG. 4A, the two or more openings of the frame member 30 are aligned in a line. Furthermore, the two or more openings of the frame member are arranged in a shape of grid pattern. The frame member 30 further includes a sloping surface 30a, which faces a peripheral side surface 3c of the phosphor layer 3 that directly covers the peripheral side surface 1c of the light-emitting element 1. The sloping surface 30a of the frame member 30 is an inner ring surface that surrounds the peripheral side surface 1c of the light-emitting element 1. The inner ring surface of the frame member 30 defines an opening in which the light-emitting element 1 is arranged.

The inner ring surface of the frame member 30 in this embodiment is a square ring surface, rectangular ring surface, or a perpendicular ring surface perpendicular to an upper surface 1a of the substrate 1. The words "square ring shape" here include a shape of square ring shape with rounded corners.

Similarly, it is possible to obtain light emitted from a rectangular region surrounded by the frame member 30 that has a rectangular ring shape. The words "rectangular ring shape" here include a shape of rectangular ring shape with rounded corners.

Figure 4B:
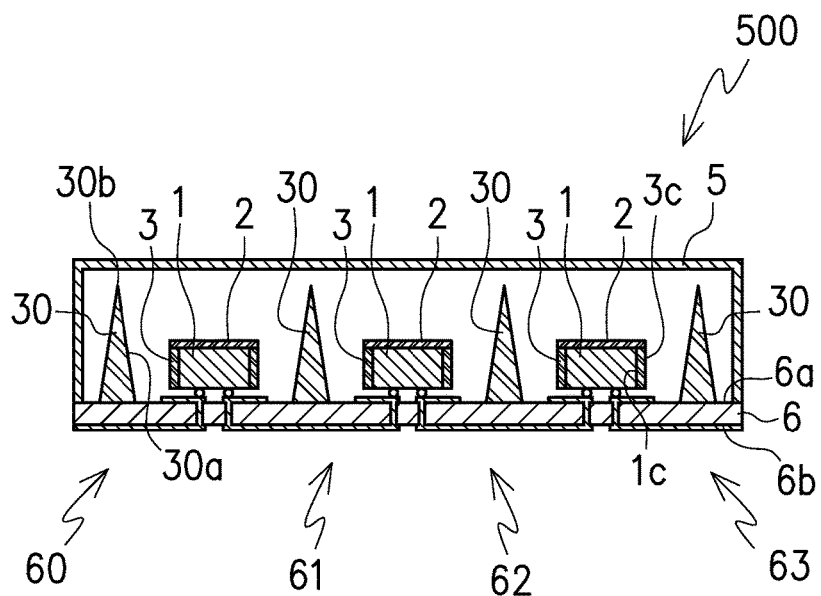
FIG. 4B is a cross sectional view of lighting device taken along a line IV-IV shown in FIG. 4A as the fifth embodiment of the present invention.

FIG. 4B is a cross sectional view of lighting device taken along a line IV-IV shown in FIG. 4A as the fifth embodiment of the present invention.

The frame member 30 is configured to shield and/or reflect light. The frame member 30 may include a silicone resin as a primary material. The words "primary material" means a material with highest percentage of amount of all which are contained in a member or an element. In this embodiment the frame member 30 is made of white-colored resin. For example, the frame member 30 may be made of silicone resin including titanium oxide ($TiO_2$) particle as a reflective particle. The frame member 30 may be opaque. As a reflective particle, titanium oxide particle, silicon dioxide particle, zirconium dioxide, aluminum oxide particle, and/or boron nitride particle is available.

In this embodiment, the three openings of the frame member 30 are aligned in a line as shown in FIG. 4A, and there are six openings of the frame member 30 are aligned in two lines or in a grid pattern. Because an upper ridge 30b of the frame member 30 is higher than an upper surface 2c of the light-emitting element 1, the frame member 30 efficiently prevents light emitted from the light-emitting element 1 in an opening from entering an adjacent opening in which another light-emitting element 1 is arranged.

Accordingly, it is possible to prevent an unnecessary phosphor excitement in a lower region of a first opening by light from a light-emitting element 1 that is arranged in a second opening adjacent to the first opening of the frame member 30, and thus, light emitted through the light-transmitting cover 5 appear to be an integrated light.

Figure 4C:
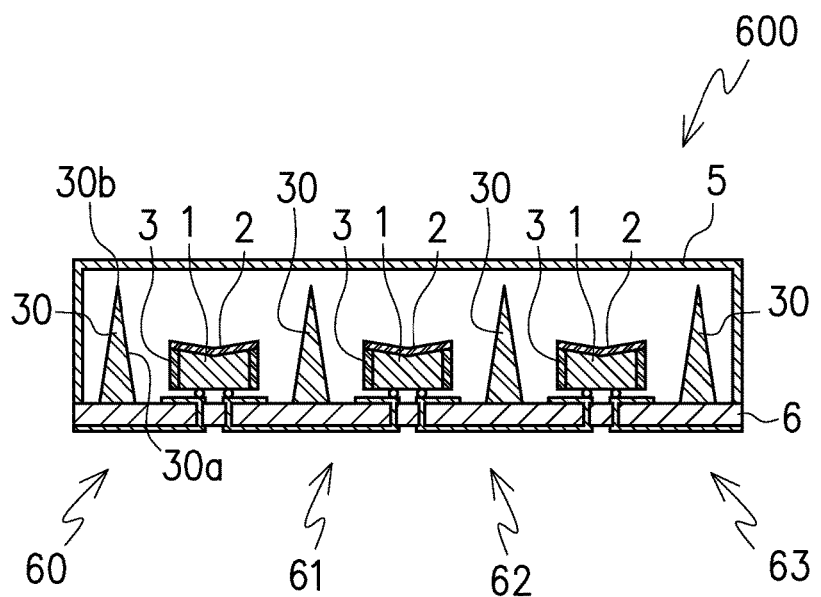
FIG. 4C is a cross sectional view of lighting device taken along a line IV-IV shown in FIG. 4A as the sixth embodiment of the present invention.

FIG. 4C is a cross sectional view of lighting device taken along a line IV-IV shown in FIG. 4A as the sixth embodiment of the present invention. Similarly to the fifth embodiment, the frame member 30 of this embodiment is made of white-colored resin. Different from the fifth embodiment, in the sixth embodiment, the light-emitting elements 1 each include a sloping surface at an upper surface 1a of each one of the light-emitting elements 1. Explanations about the sloping surface of the light-emitting element 1 and the light-reflecting layer 2 arranged in contact with the sloping surface of the light-emitting element 1 can be referred to the explanations of the lighting device 400 according to the fourth embodiment and the explanations of the lighting device 200 (200') according to the second embodiment as the first variation with FIGS. 2A-2C and the second variation with FIGS. 2A'-2C'.

Figure 4D:
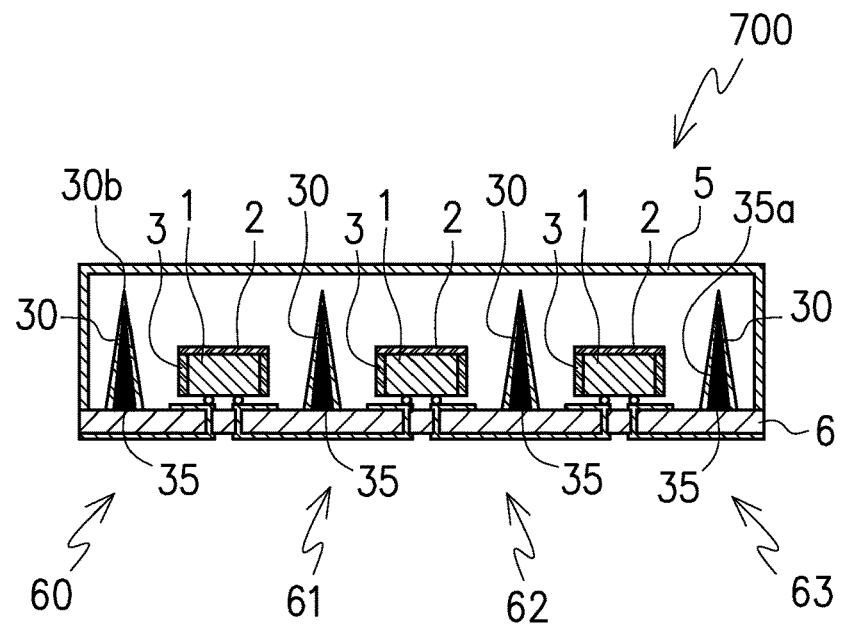
FIG. 4D is a cross sectional view of lighting device taken along a line IV-IV shown in FIG. 4A as the seventh embodiment of the present invention.

FIG. 4D is a cross sectional view of lighting device taken along a line IV-IV shown in FIG. 4A as the seventh embodiment of the present invention.

Figure 4E:
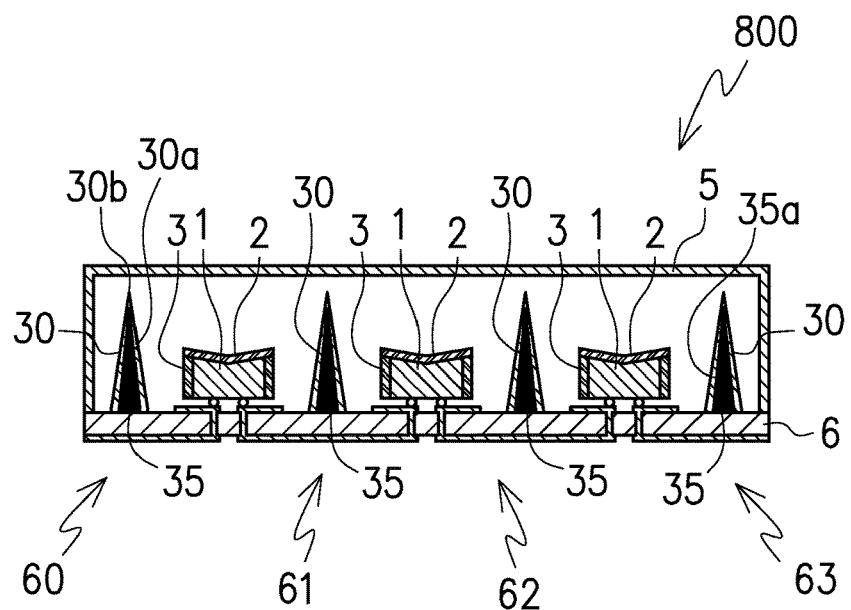
FIG. 4E is a cross sectional view of lighting device taken along a line IV-IV shown in FIG. 4A as the eighth embodiment of the present invention.

FIG. 4E is a cross sectional view of lighting device taken along a line IV-IV shown in FIG. 4A as the eighth embodiment of the present invention. Explanations about the sloping surface of the light-emitting element 1 and the light-reflecting layer 2 arranged in contact with the sloping surface of the light-emitting element 1 can be referred to the explanations of the lighting device 400 according to the fourth embodiment and the explanations of the lighting device 200 (200') according to the second embodiment as the first variation with FIGS. 2A-2C and the second variation with FIGS. 2A'-2C'.

The white-colored resin of the frame member 30 constitutes an outer shape of the frame member 30 with an opening in which the light-emitting element 1 is electrically mounted on electrodes arranged on an upper surface 6a of the substrate 6.

As shown in FIGS. 4D and 4E, different from the variation of the frame member 30 shown in FIG. 4B and FIG. 4C, the frame member 30 includes a light-shielding member 35 embedded in the white-colored resin. The frame member 30 may have a cross-sectional shape that appears to be triangle when viewed from a direction, and the light-shielding member 35 also may have a cross-sectional shape that appears to be triangle when viewed from a direction.

The white-colored resin of the frame member 30 includes a reflective particle. The light-shielding member 35 of the frame member 30 may be made of a black-colored resin. Also, the light-shielding member 35 of the frame member 30 includes a sloping surface 35a inside the white-colored resin of the frame member 30. The black-colored resin of the light-shielding member 35 is positioned inside the white-colored resin and has a shape surrounding the light-emitting element 1. Furthermore, the light-shielding member 35 of the frame member 30 may include a metal frame embedded in the white-colored resin of the frame member 30.

Accordingly, the light-shielding member 35 also has a similar outer shape of frame member 30, and the outer shape of the light-shielding member 35 is smaller than the outer shape of the white-colored resin in a plan view.

Because the light-shielding member 35 of the black-colored resin is entirely inside the white-colored resin of the frame member 30, the light-shielding member 35 is not shown in FIG. 4A as embodiments 700(800). The light-shielding member 35 of the frame member 30 may contain a graphite powder. Also, the light-shielding member 5 may contain a metal powder, which has a better light-absorption property than a reflective particle. If the frame member 30 includes the black-colored resin inside the white-colored resin, light hit the frame member 30 is efficiently reflected by the white-colored resin portion and sufficiently shielded by the black-colored resin portion to prevent lateral light of the light-emitting element 1 from passing through the frame member 30.

The sloping surface 35a of the black-colored resin 35 corresponds to the sloping surface 30a of the white-colored resin of the frame member 30. Accordingly, the sloping surface 35a of the black-colored resin 5 faces the peripheral side surface 1c of the light-emitting element 1 in the white-colored resin of the frame member 30.

Furthermore, while certain embodiments of the present inventive subject matter have been illustrated with reference to specific combinations of elements, various other combinations may also be provided without departing from the teachings of the present inventive subject matter. Thus, the present inventive subject matter should not be construed as being limited to the particular exemplary embodiments described herein and illustrated in the Figures, but may also encompass combinations of elements of the various illustrated embodiments.

Many alterations and modifications may be made by those having ordinary skill in the art, given the benefit of the present disclosure, without departing from the spirit and scope of the inventive subject matter. Therefore, it must be understood that the illustrated embodiments have been set forth only for the purposes of example, and that it should not be taken as limiting the inventive subject matter as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the inventive subject matter.

What is claimed is:

1. A lighting device comprising:
    a substrate comprising an upper surface, and at least one pair of electrodes arranged on the upper surface of the substrate;
    two or more light-emitting elements each comprising:
        a lower surface;
        an upper surface;
        four peripheral side surfaces;
        a first electrode and a second electrode on the lower surface, the first electrode and the second electrode electrically connected to the at least one pair of electrodes of the substrate;
        a phosphor layer with a constant width being arranged in contact with the four peripheral side surfaces of the light-emitting element, the phosphor layer comprising an upper surface and four peripheral side surfaces; and
        a light-reflecting layer that is arranged in contact with the upper surface of the light-emitting element and the upper surface of the phosphor layer, the light-reflecting layer being arranged to be free from contact with any portion of the four peripheral side surfaces of the phosphor layer;
    a light-transmitting cover that is transparent or translucent and arranged above the light-reflecting layers of the two or more light-emitting elements; and
    a frame member disposed on the substrate to surround the four peripheral side surfaces of each of the two or more light-emitting elements and comprising two or more openings, each of the two or more openings having at least one of the two or more light-emitting elements arranged therein, the frame member being configured to shield and/or reflect light and comprising a white-colored resin and a light-shielding member buried in the white-colored resin of the frame member.

2. The lighting device according to claim 1, wherein the two or more light-emitting elements and the phosphor layers are same in height.

3. The lighting device according to claim 1, wherein the phosphor layers are smaller than the two or more light-emitting elements in width.

4. The lighting device according to claim 1, wherein the upper surface of each of the two or more light-emitting elements comprises a sloping surface.

5. The lighting device according to claim 1, wherein the two or more openings of the frame member are aligned in a line.

6. The lighting device according to claim 1, wherein the two or more openings of the frame member are arranged in a shape of a grid and formed so as to separate each of the two or more light-emitting elements from each other.

7. The lighting device according to claim 1,
wherein the two or more openings of the frame member each comprise sloping surfaces facing the four peripheral side surfaces of the at least one of the two or more light-emitting elements.

8. The lighting device according to claim 1,
wherein the light-reflecting layer of each of the two or more light-emitting elements comprises a metallic layer, and
wherein the metallic layer of the light-reflecting layer of each of the two or more light-emitting elements has a reflectivity of 50% or more.

* * * * *